US010319780B2

(12) United States Patent
Ou et al.

(10) Patent No.: US 10,319,780 B2
(45) Date of Patent: Jun. 11, 2019

(54) LIGHT-EMITTING ELEMENT HAVING A PLURALITY OF LIGHT-EMITTING STRUCTURES

(71) Applicant: Epistar Corporation, Hsinchu (TW)

(72) Inventors: Chen Ou, Hsinchu (TW); Chun-Wei Chang, Hsinchu (TW); Chih-Wei Wu, Hsinchu (TW); Sheng-Chih Wang, Hsinchu (TW); Hsin-Mei Tsai, Hsinchu (TW); Chia-Chen Tsai, Hsinchu (TW); Chuan-Cheng Chang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/675,351

(22) Filed: Aug. 11, 2017

(65) Prior Publication Data

US 2017/0365637 A1    Dec. 21, 2017

Related U.S. Application Data

(63) Continuation of application No. 14/470,396, filed on Aug. 27, 2014, now Pat. No. 9,768,227.

(30) Foreign Application Priority Data

Aug. 27, 2013  (TW) .............................. 102130742 A

(51) Int. Cl.
*H01L 27/15*    (2006.01)
*H01L 33/08*    (2010.01)
(Continued)

(52) U.S. Cl.
CPC .............. *H01L 27/15* (2013.01); *H01L 33/08* (2013.01); *H01L 33/20* (2013.01); *H01L 33/38* (2013.01)

(58) Field of Classification Search
CPC .............................. H01L 27/15; H01L 33/08
See application file for complete search history.

(56) References Cited

U.S. PATENT DOCUMENTS 9,324,691 B2    4/2016  Jing et al.
2012/0049223 A1*  3/2012  Yang ..................... H01L 33/38
                                                              257/98

(Continued)

FOREIGN PATENT DOCUMENTS

CN    103094435 A    5/2013
TW    201203533 A    1/2012

*Primary Examiner* — Farun Lu
(74) *Attorney, Agent, or Firm* — Ditthavong & Steiner, P.C.

(57) ABSTRACT

A light-emitting device includes a first semiconductor layer; a first, a second and a third light-emitting structures formed on the same first semiconductor layer; a first trench between the first and the second light-emitting structures; a second trench between the second and the third light-emitting structures, wherein the first and the second trenches include bottom portions exposing a surface of the first semiconductor layer; a third trench in one of the light-emitting structures, exposing the first semiconductor layer and extending along a direction parallel with the first semiconductor layer; an insulating bridge part in the first and the second trenches, connecting the light-emitting structures; a first electrode in the third trench, electrically connecting to the first semiconductor layer; and a second electrode, including a pad on one of the light-emitting structures and an extending part; wherein the extending part is formed on the insulating bridge part and extends to the light-emitting structures.

9 Claims, 13 Drawing Sheets

(51) Int. Cl.
*H01L 33/20* (2010.01)
*H01L 33/38* (2010.01)

(56) References Cited

U.S. PATENT DOCUMENTS

2013/0105845 A1   5/2013  Kim et al.
2014/0191677 A1*  7/2014  Kang ................. H05B 37/0209
                                                              315/193

* cited by examiner

LIGHT-EMITTING ELEMENT HAVING A PLURALITY OF LIGHT-EMITTING STRUCTURES

CROSS-REFERENCE TO RELATED APPLICATIONS

This application a continuation application of U.S. patent application Ser. No. 14/470,396, entitled "LIGHT-EMITTING ELEMENT HAVING A PLURALITY OF LIGHT-EMITTING STRUCTURES", filed on Aug. 27, 2014, which claims priority to and the benefit of Taiwan Application Serial Number 102130742 filed on Aug. 27, 2013, which is incorporated by reference in its entirety.

BACKGROUND

Technical Field

The present application discloses a light-emitting device comprising a plurality of light-emitting structures.

Description of the Related Art

As shown in FIG. 1A, optoelectronic devices, such as light emitting diodes (LEDs), have been widely applied in optical displays, traffic signals, data storage devices, communication systems, lighting devices and medical instruments. Besides, the LED can be connected to and combined with other components to construct a lighting device. FIG. 1B shows a conventional art of a light-emitting device. As shown in FIG. 1B, a light-emitting device 10 includes a submount 12 comprising a circuit, a solder 14 formed on the submount 12, wherein a light emitting diode 1 is fixed on the submount 12 and electrically connected with the circuit 12 by the solder, and electrical connections 16 used to electrically connect electrodes 11 and 13 and the circuit 120 on the submount 12. The submount 12 can be a lead frame or a large mounting substrate.

SUMMARY

A light-emitting device comprises a first semiconductor layer having an uppermost surface and a bottommost surface opposite to the uppermost surface; a first light-emitting structure, a second light-emitting structure and a third light-emitting structure formed on the same first semiconductor layer, wherein the first semiconductor layer is continuous; a first trench formed between the first light-emitting structure and the second light-emitting structure, comprising a bottom portion exposing a first surface of the first semiconductor layer; a second trench formed between the second light-emitting structure and the third light-emitting structure, comprising a bottom portion exposing the first surface of the first semiconductor layer; a third trench formed in one of the first, the second and the third light-emitting structures, exposing the first semiconductor layer and extending along a first direction, wherein the first direction is parallel with the first semiconductor layer; an insulating bridge part formed in the first trench and the second trench, connecting the first, the second and the third light-emitting structures; a first electrode formed in the third trench, electrically connecting to the first semiconductor layer; and a second electrode, comprising a second pad formed on one of the first, the second and the third light-emitting structures and a second extending part extending from the second pad; wherein the first, the second and the third trenches pass through the uppermost surface of the first semiconductor layer but does not extend to the bottommost surface of the first semiconductor layer; wherein the second extending part is formed on the insulating bridge part and extends to the first, the second and the third light-emitting structures.

A light-emitting device comprises a first semiconductor layer having an uppermost surface and a bottommost surface opposite to the uppermost surface; a first light-emitting structure and a second light-emitting structure formed on the same first semiconductor layer, wherein the first semiconductor layer is continuous; a first trench formed between the first light-emitting structure and the second light-emitting structure, comprising a bottom portion exposing a first surface of the first semiconductor layer; a first electrode formed on and electrically connecting to the first semiconductor layer; and a second electrode formed on the second semiconductor layer, comprising a second pad and a plurality of second extending parts extending from the second pad; wherein the second pad is formed between the first and the second light-emitting structures, and the plurality of extending parts extend to the first and the second light-emitting structures, respectively; wherein the first trench pass through the uppermost surface of the first semiconductor layer but does not extend to the bottommost surface of the first semiconductor layer; wherein the first trench comprises an equal width from a top view.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1A:
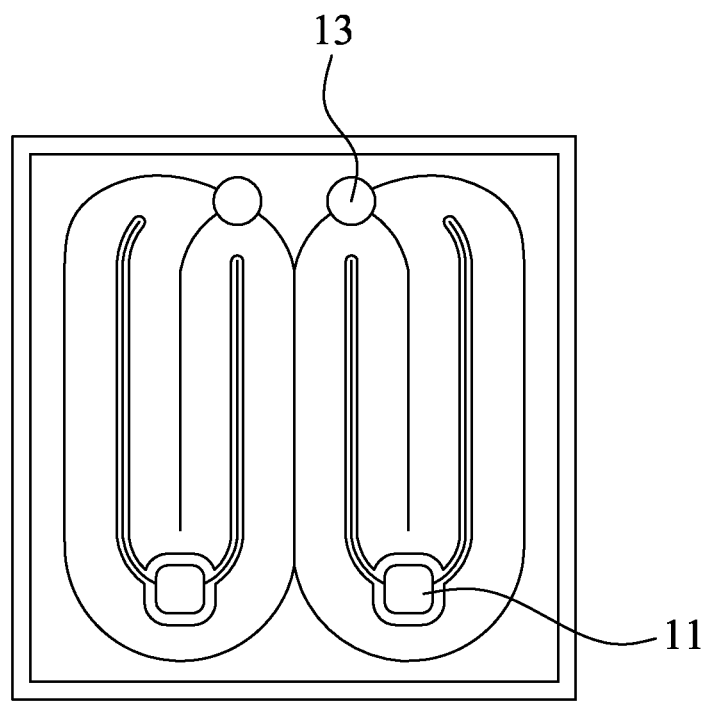
FIG. 1A is a top view of a conventional LED.
Figure 1B:
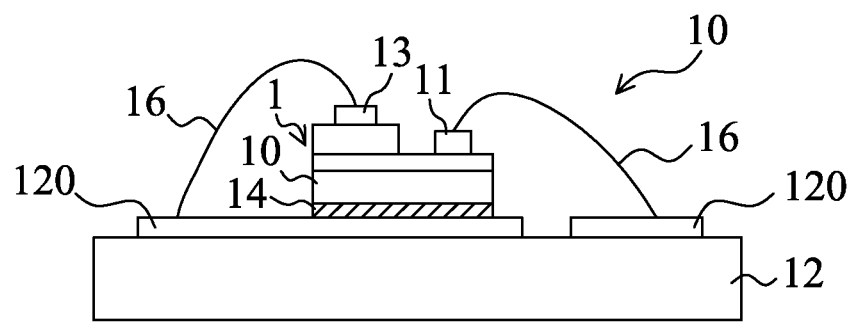
FIG. 1B shows a conventional light-emitting device.
Figure 2A:
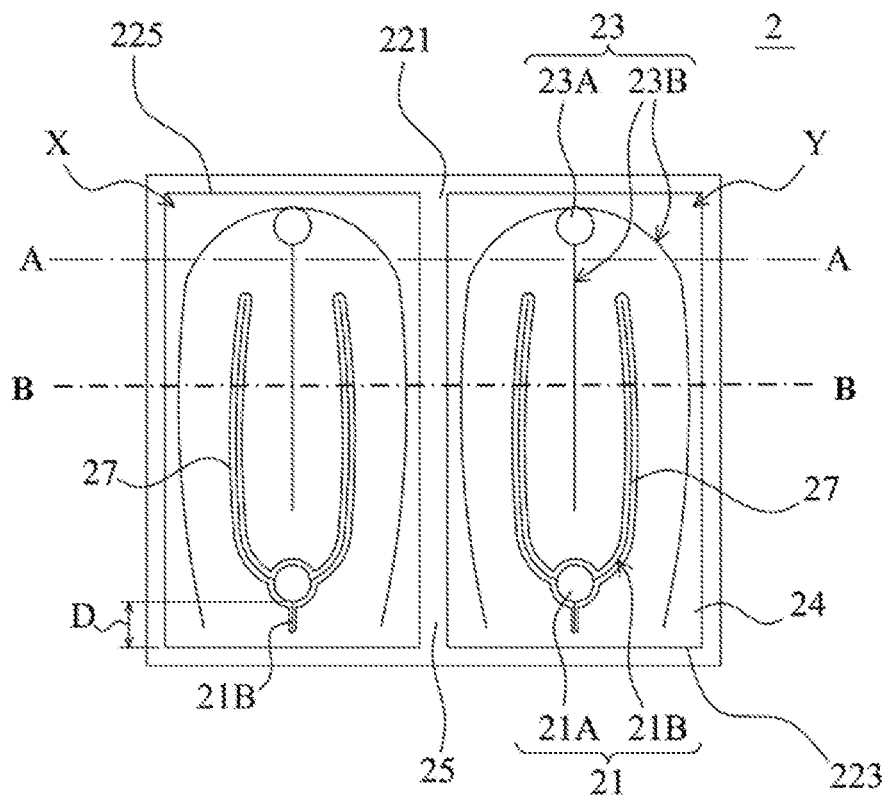
FIG. 2A is a top view of a light-emitting device in accordance with one embodiment of present disclosure.
Figure 2B:
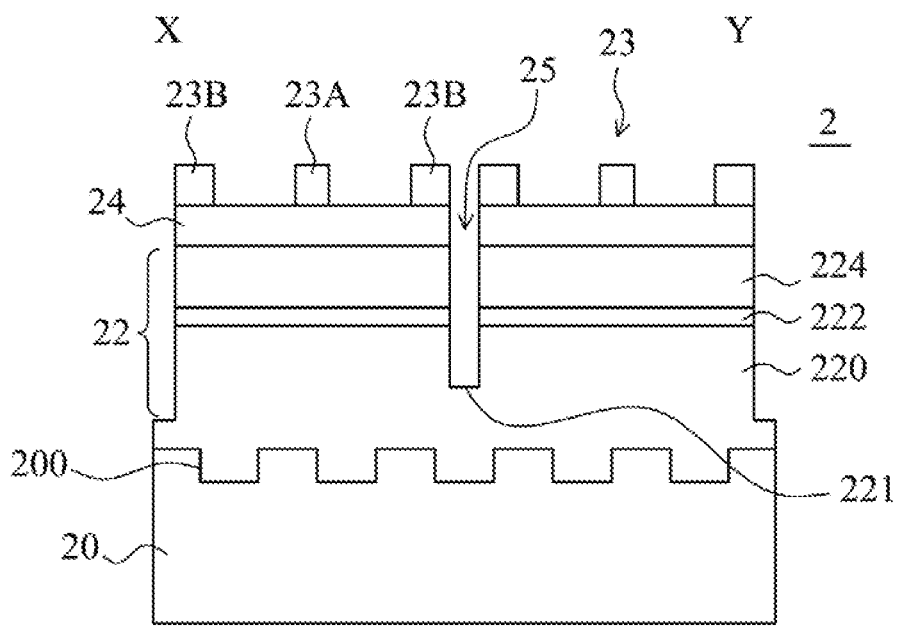
FIG. 2B is a cross-sectional view of a light-emitting device disclosed in FIG. 2A.

FIG. 2A shows a top view of a light-emitting device in accordance with an embodiment of the present disclosure. FIG. 2B shows a cross-sectional view taken along AA line of the light-emitting device in FIG. 2A. As shown in FIG. 2B, the light-emitting device 2 includes a substrate 20, a light-emitting stack 22 formed on the substrate 20, and a transparent conductive layer 24 formed on the light-emitting stack 22. The light-emitting stack 22 includes a first semiconductor layer 220, an active layer 222 and a second semiconductor layer 224 formed on the substrate 20 sequentially. A first trench 25 is formed in the transparent conductive layer 24 and the light-emitting stack 22 so as to expose a first upper surface 221 of the first semiconductor layer 220. In this manner, the light-emitting stack 22 and the transparent conductive layer 24 on the first semiconductor layer 220 are separated into a first light-emitting structure X and a second light-emitting structure Y. In other words, the first and the second light-emitting structures X, Y share the first semiconductor layer 220, but in different regions on the first semiconductor layer 220, each light-emitting structure X, Y respectively includes an active layer 222, a second semiconductor layer 224, and a transparent conductive layer 24. As shown in FIG. 2A, second trenches 27 are formed in the first and the second light-emitting structures X and Y respectively, and therefore the first upper surface 221 is exposed. A first electrode 21 is disposed on the first upper surface 221 in the second trench 27, and the second electrode 23 is disposed on the transparent conductive layer 24. A first trench 25 is formed between the first light-emitting structure X and the second light-emitting structure Y, and the first electrode 21 and the second electrode 23 are both disposed on the outer region beyond the first trench 25. That is, no electrode is disposed in the first trench 25. By such configuration, current is distributed in the first and the second light-emitting structures X and Y respectively and thereby to improve the luminous efficiency of the light-emitting device 2, as shown in FIG. 2E. From the top view, the first and the second light-emitting structures X, Y have the same pattern. In this embodiment, the light-emitting structures having the same pattern indicates that the light-emitting structures have rectangular shape with same size, same electrode layouts, and symmetrical locations of the electrodes, which benefit the current spreading and alignment during follow-up wire bonding process. FIG. 2F, a cross-sectional view taken across line B-B of FIG. 2A, shows in more detail, cross-sectional views of second trench 27 and first electrode 21 and their relative positions.

The first electrode 21 and/or the second electrode 23 are used to connect to an external voltage. The material of the first electrode 21 and the second electrode 23 can be transparent conductive material or metal material. The transparent conductive material includes but is not limited to ITO, InO, SnO, CTO, ATO, AZO, ZTO, GZO, IWO, ZnO, AlGaAs, GaN, GaP, GaAs, GaAsP, IZO, or diamond-like Carbon (DLC). The metal material includes but is not limited to Al, Cr, Cu, Sn, Au, Ni, Ti, Pt, Pb, Zn, Cd, Sb, Co or alloy of the materials described above. The first electrode 21 includes a first pad 21A and a plurality of first extending parts 21B which extending from the first pad 21A. And the second electrode 23 includes a second pad 23A and a plurality of second extending parts 23B which extending from the second pad 23A. The first pad 21A and the second pad 23A are used as wiring positions in follow-up wiring bonding process. A plurality of first extending parts 21B and second extending parts 23B are used to conduct current and improve current spreading so as to enhance luminous efficiency of the light-emitting device 2. At least one of the first extending parts 21B is formed between the second extending parts 23B to spread current uniformly and prevent current from concentrating in local area which reduces the light-emitting area. The second semiconductor layer 224 includes a first side 223 and a second side 225 opposite to the first side 223. The first pad 21A is set close to the first side 223 and the second pad 23A is set close to the second side 225. A gap D is set between the first pad 21A and the first side 223. D is substantially equal to the size of the first pad 21A. For example, if the first pad 21A is a circular shape, D is approximately the diameter of the circular shape; if the first pad is a rectangular shape, D is approximately the length of the rectangular shape. Therefore, current flowing from the first pad 21A can be spread effectively so as to improve luminous efficiency of the light-emitting device 2. In another embodiment, the gap D is approximately 60 µm to 100 µm. Besides, at least one of the first extending parts 21B has different extending direction from those of other extending parts 21B. For example, one of the first extending parts 21B extends to the first side 223 and other extending parts 21B extend to the second side 225 to improve current spreading and luminous efficiency of the light-emitting device 2.

The transparent conductive layer 24 improves ohmic contact between the light-emitting stack 22 and the second electrode 23 as well as current spreading. The transparent conductive layer 24 is transparent to light emitted from the light-emitting stack 22. The material of the transparent conductive layer 24 can be conductive material which includes but is not limited to ITO, InO, SnO, CTO, ATO, AZO, ZTO, GZO, ZnO, MgO, AlGaAs, GaN, GaP or IZO. The material of the light-emitting stack 22 can be conductive material which includes one or more than one element selected form Ga, Al, In, P, N, Zn, Cd or Se. The polarities of the first semiconductor layer 220 and the second semiconductor layer 224 are different to generate electrons and electron holes. In another embodiment, the second semiconductor layer 224 has a textured upper surface in order to suppress total reflection so as to improve luminous efficiency of the light-emitting device 2. Moreover, the active layer 222 emits one or more than one color light. The light can be visible or invisible. The structure of the active layer 224 can be single heterostructure (SH), double heterostructure (DH), double-side double heterostructure (DDH), multi-quantum well (MQW) or quantum dot.

The substrate 20 supports the light-emitting stack 22 and other layers or other structure which disposed thereon. The material of the substrate 22 includes a transparent substrate or an electrically conductive substrate. The material of the transparent substrate includes but is not limited to sapphire, diamond, glass, epoxy, quartz, acryl, $Al_2O_3$, ZnO or MN, etc. The material of the electrically conductive substrate can be Cu, Al, Mo, Sn, Zn, Cd, Ni, Co, diamond like Carbon (DLC), Graphite, Carbon fiber, metal matrix composite (MMC), ceramic matrix composite (CMC), Si, IP, ZnSe, GaAs, SiC, GaP, GaAsP, InP, $LiGaO_2$ or $LiAlO_2$. Among these materials, sapphire, GaAs, SiC and Si can be used as a growth substrate. The substrate 20 has a patterned upper surface 200 which can improve epitaxy quality and scattering the light emitted from the light-emitting stack 22.

Figure 2C:
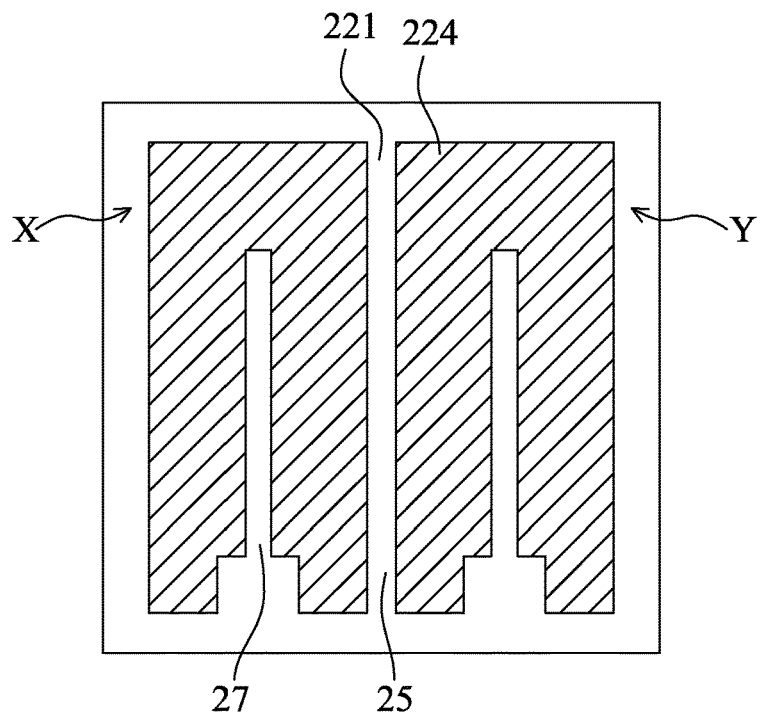
FIGS. 2C~2D show a method of manufacturing the light-emitting device in accordance with one embodiment of present disclosure.
Figure 2D:
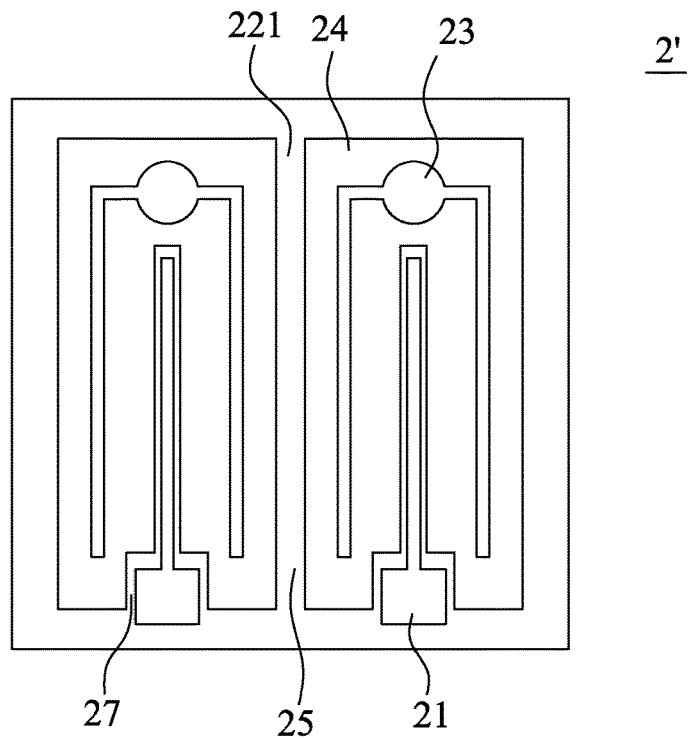
Figure 2E:
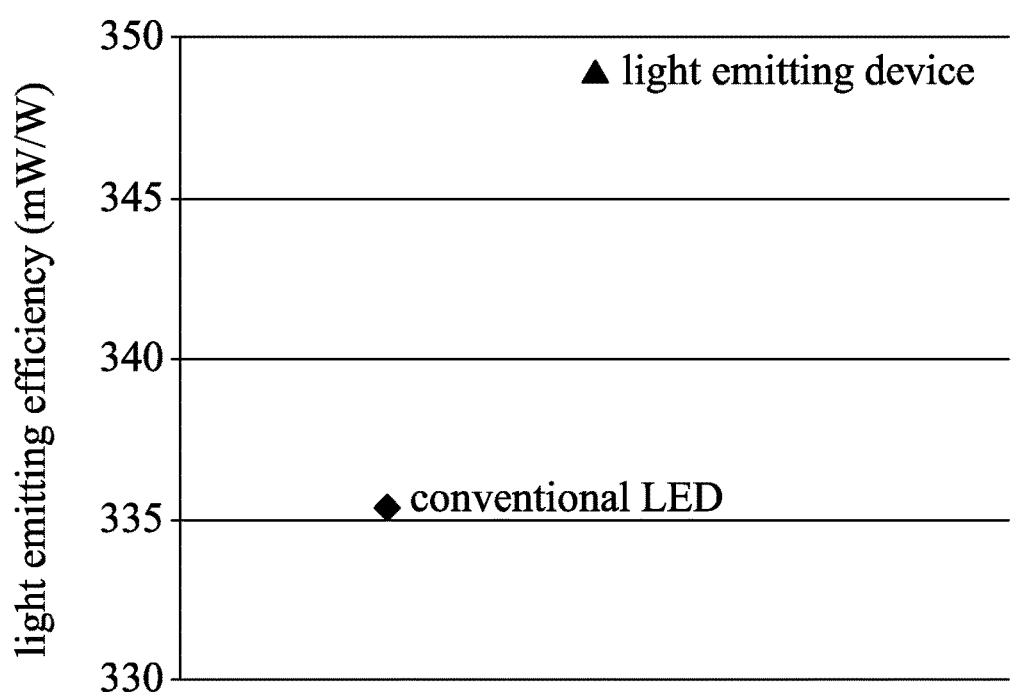
FIG. 2E is a luminous efficiency diagram of a conventional LED and a light-emitting device in accordance with one embodiment of present disclosure.
Figure 2F:
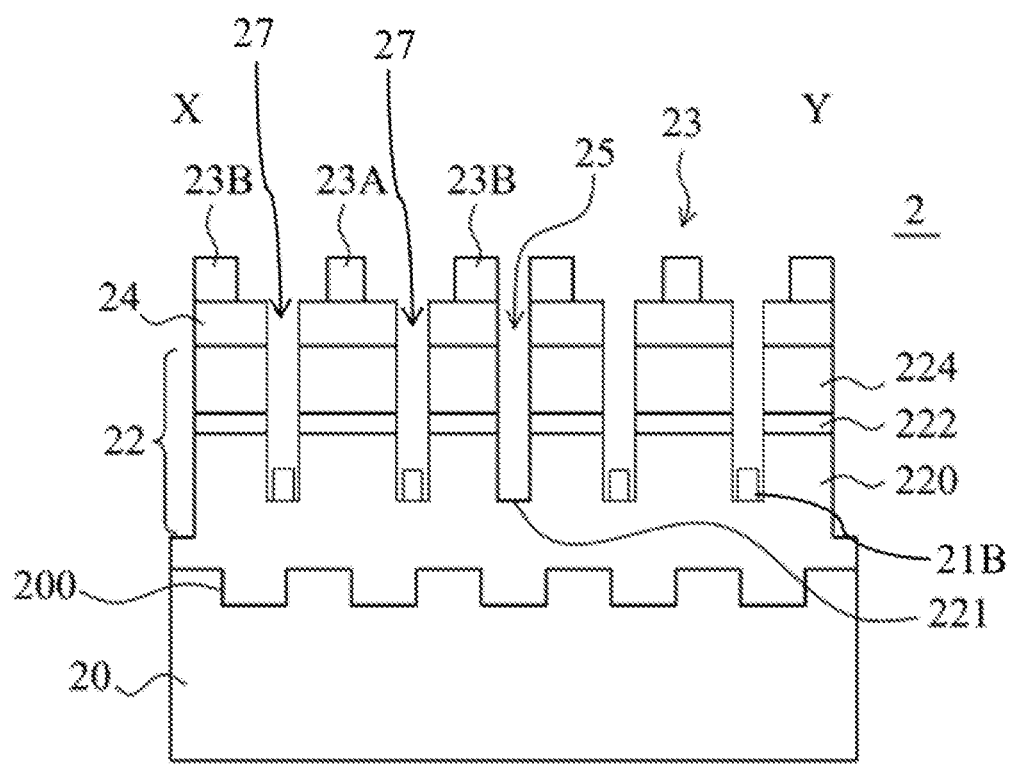
FIG. 2F is a cross-sectional view of a light-emitting device, along line B-B, disclosed in FIG. 2A.

FIGS. 2C~2D show a manufacturing process of a light-emitting device 2' in accordance with another embodiment. As shown in FIG. 2C, a light-emitting stack 22 is formed on a substrate 20. Then, a portion of a second semiconductor layer 224 and an active layer 222 are removed to form a first trench 25 and a second trench 27. A first upper surface 221 of a first semiconductor layer 220 is exposed, wherein the first trench 25 separates the second semiconductor layer 224 and the active layer 222 into a first light-emitting structure X and a second light-emitting structure Y. The two second trenches 27 locate in the first light-emitting structure X and the second light-emitting structure Y, respectively. As shown in FIG. 2D, a transparent conductive layer 24 is formed on the second semiconductor layer 224. Then, first electrode 21 is formed in the second trench 27 and a second electrode 23 is formed on the transparent conductive layer 24 to form the light-emitting device 2'.

Figure 3A:
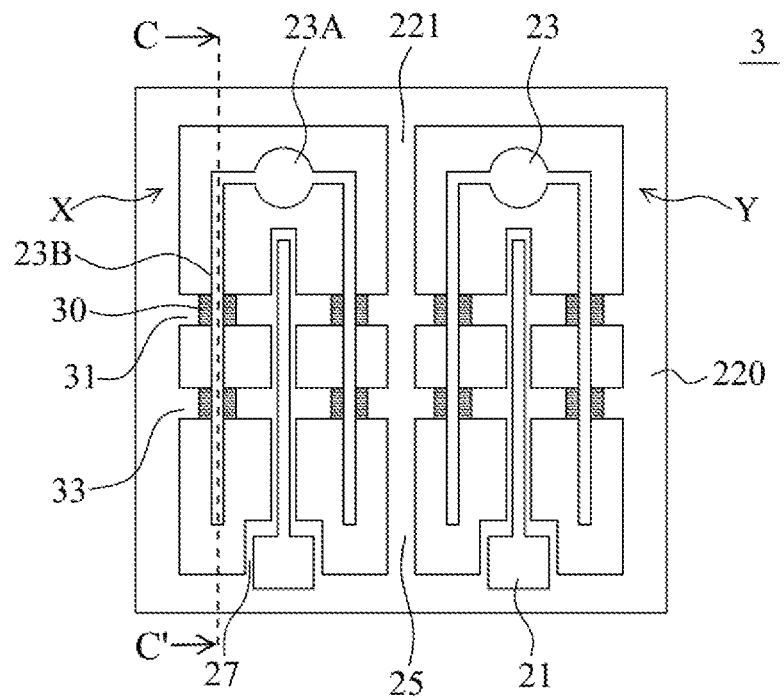
FIGS. 3A~3B are top views of light-emitting devices in accordance with another embodiments of present disclosure.
Figure 3B:
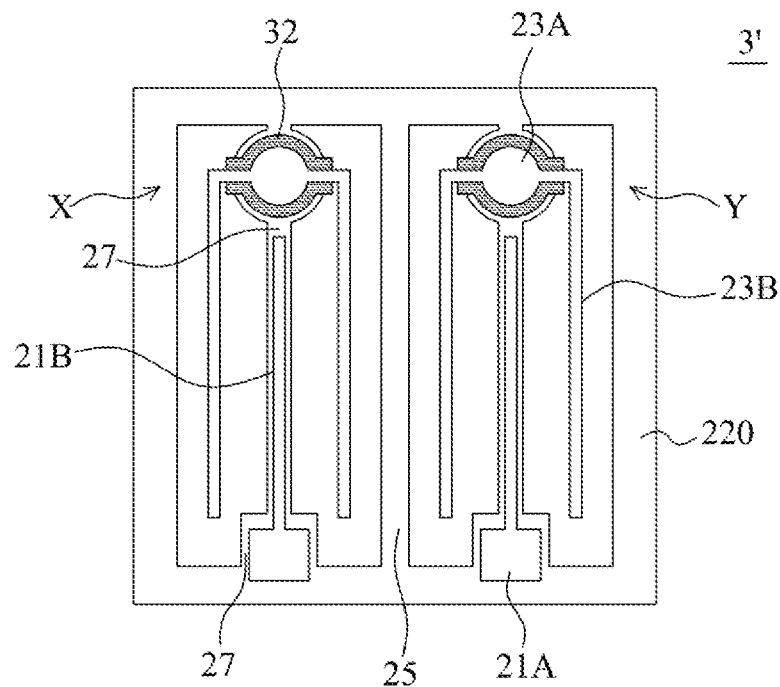
Figure 3C:
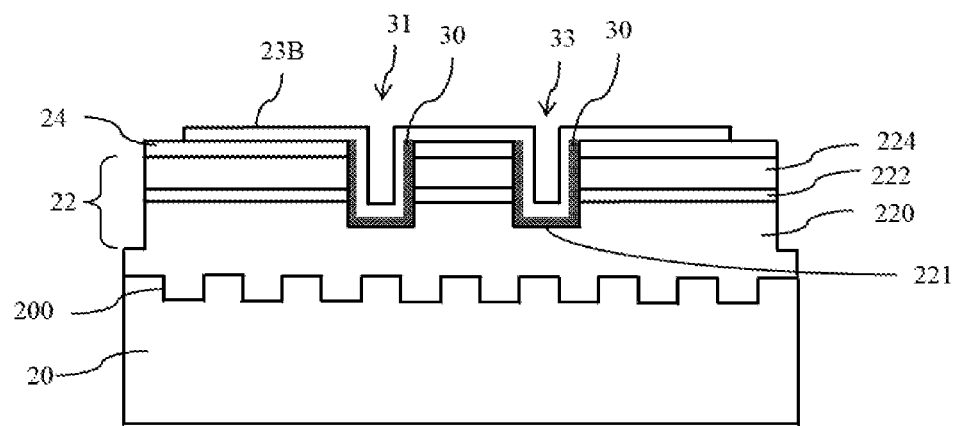
FIG. 3C is a cross-sectional view of the light-emitting device, along line C-C', disclosed in FIG. 3A.

FIG. 3A and FIG. 3B show top views of a light-emitting device 3 and 3' in accordance with another embodiment. As shown in FIG. 3A, the light-emitting device 3 has a similar structure with the light-emitting device 2 and further includes a third trench 31 and a fourth trench 33 to expose a first upper surface 221. The third trench 31 and the fourth trench 33 are not parallel with the first trench 25 and the second trench 27 so that the third trench 31/the fourth trench 33 intersects the first trench 25/the second trench 27. Thus, the first light-emitting structure X and the second light-emitting structure Y are separated into a plurality of light emitting regions with smaller area. A plurality of first bridge parts 30 is formed in the third trench 31 and the fourth trench 33 and set between the light emitting regions in the first and the second light-emitting structures X, Y. The first bridges are used to connect the light emitting regions. As a result, the second extending parts 23B cross over and pass through a plurality of the first bridge parts 30 to extend to a plurality of the light emitting regions and conduct current into these light emitting regions. Since the first and the second lighting structures X, Y are separated into a plurality of light emitting regions with smaller area, current is uniformly conducted and spread into each light emitting region through a plurality of the second extending parts 23B so as to improve luminous efficiency of the light-emitting device 3. FIG. 3C is a cross-sectional view taken across line C-C' of FIG. 3A, It shows in more detail, cross-sectional views of third trench 31 and fourth trench 33 and their relative positions. As shown in FIG. 3B, the light-emitting device 3' has a similar structure with the light-emitting device 2. Second trenches 27 separate the first lighting structure X and the second lighting structure Y into a plurality of light emitting regions with smaller area. An insulating layer 32 is formed in the second trenches 27 and on the lighting regions and is away from the first pads 21A. Second pads 23A are formed on the insulating layer 32 and extend to a plurality of light emitting regions with a smaller area. Since the first and the second light-emitting structures X, Y are separated into a plurality of lighting regions with a smaller area, current is uniformly conducted into each light emitting region with smaller area through a plurality of the second extending parts 23B thereby luminous efficiency of the light-emitting device 3' is improved. In the embodiments described above, second electrodes 23 are insulated from the first semiconductor 220 by the first bridge part 30 and/or the insulating layer 32. The first bridge part 30 and/or the insulating layer 32 can be made of electrically insulative material such as polyimide (PI), Benzocyclobutene (BCB), Perfluorocyclobutane (PFCB), MgO, Sub, Epoxy, Acrylic resin, Cycle Olefin copolymer (COC), Polymethylmethacrylate (PMMA), Polyethylene terephthalate (PET), Polycarbonate (PC), Polyetherimide, Fluorocarbon Polymer, Glass, $Al_2O_3$, $SiO_x$, $TiO_2$, $Ta_2O_5$, $SiN_x$, $MgF_2$, Spin-on glass (SOG) or Tetraethyl orthosilicate (TEOS).

Figure 4A:
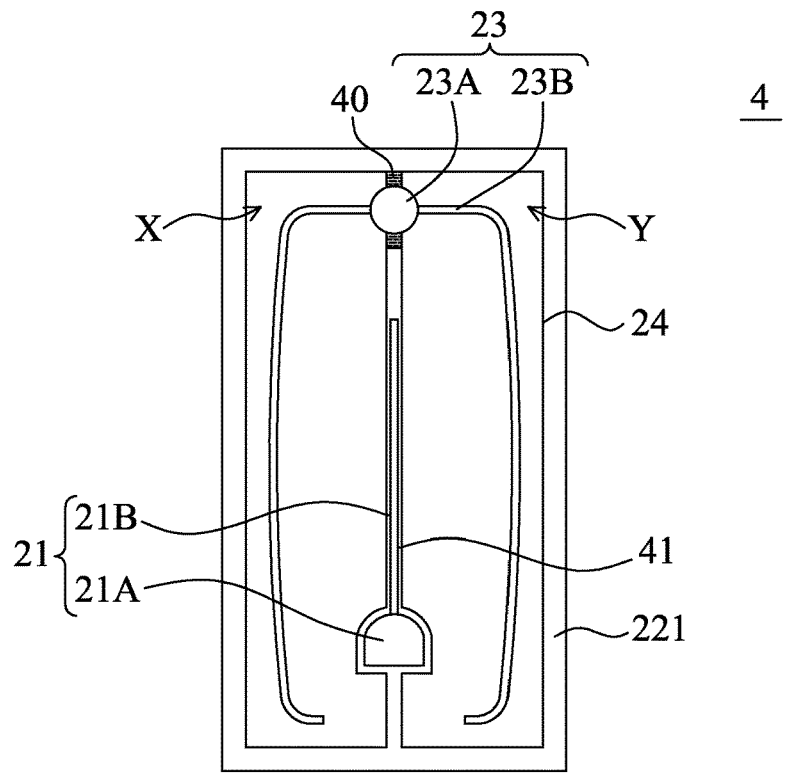
FIGS. 4A~4C are top views of light-emitting devices in accordance with another embodiments of present disclosure.

FIG. 4A shows a top view of a light-emitting device 4 according to another embodiment. The structure of the light-emitting device 4 is similar with that of the light-emitting device 2. The light-emitting device 4 includes a substrate 20, a light-emitting stack 22 formed on the substrate 20, and a transparent conductive layer 24 formed on the light-emitting stack 22, wherein the light-emitting stack includes a first semiconductor layer 220, an active layer 222 and a second semiconductor layer 224 sequentially formed on the substrate 20. As shown in FIG. 4A, a first trench 41 is formed in the transparent conductive layer 24 and the light-emitting stack 22, and exposes a first upper surface 221 so as to separates the transparent conductive layer 24 and the light-emitting stack 22 on the first semiconductor layer 220 into a first light-emitting structure X and a second light-emitting structure Y. In this embodiment, the light-emitting stack 22 and the transparent conductive layer 24 are not completely removed while forming the first trench 41, and a portion of the light-emitting stack 22 and the transparent conductive layer 24 are reserved to form a first bridge part 40 which used to connect the first light-emitting structure X with the second light-emitting structure Y. A first electrode 21 is formed in the first trench 41; a second electrode 23 is formed on the first bridge part 40 to conduct current into the first and the second light-emitting structures X. Y. Since the first light-emitting structure X and the second light-emitting structure Y have smaller area of light emitting region, current can be uniformly spread in the first and the second light-emitting structures X, Y and to improve luminous efficiency of the light-emitting device 4. From the top view, the first light-emitting structure X and the second light-emitting structure Y have the same pattern. In this embodiment, the light-emitting structures having the same pattern indicate that the light-emitting structures have rectangular structures with same size, same electrode layouts, and symmetrical locations of the electrodes. Such configuration benefits the current spreading and alignment during follow-up wire bonding process.

Figure 4B:
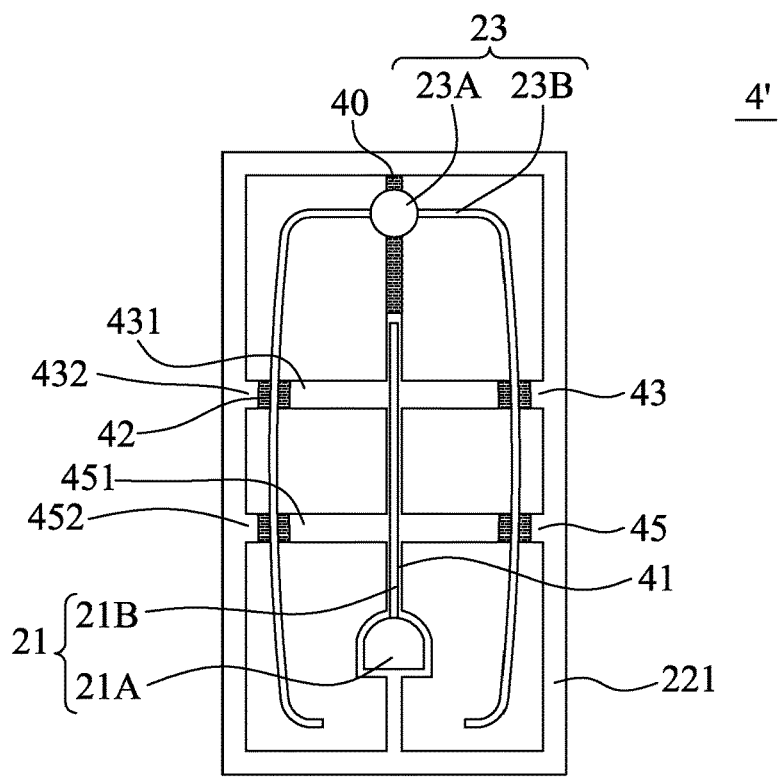
Figure 4C:
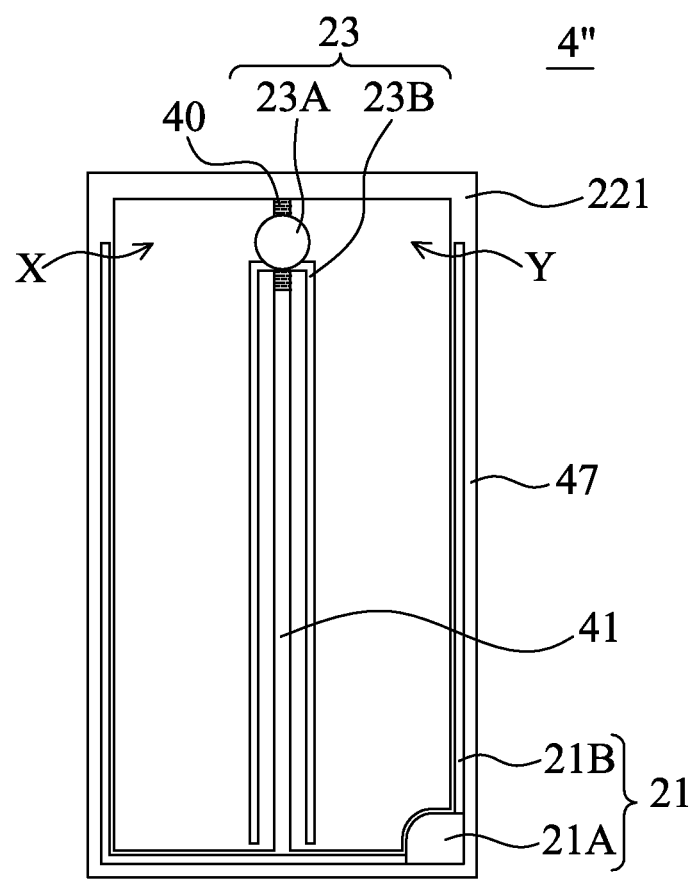

FIG. 4B shows a top view of a light-emitting device 4' according to another embodiment. The light-emitting device 4' has a similar structure with that of the light-emitting structure 4 and further includes a second trench 43 and a third trench 45 so as to expose a upper surface 221. The second trench 43 and the third trench 45 are not parallel with the first trench 41. The second trench 43 and the third trench 45 cross over the first trench 41 and thereby the first and the second light-emitting structures X, Y are separated into a plurality of light emitting regions with smaller area. A plurality of second bridge parts 42 is formed between the light emitting regions and locates in the second trench 43 and the third trench 45. The second bridge parts 42 are used to connect the light emitting regions. The second trench 43 is partitioned into a first region 431 and a second region 432 by the second bridge parts 42. The second bridge part 42 locates between the first region 431 and the second region 432. The third trench 43 is partitioned into a third region 451 and a fourth region 452 by the second bridge parts 42. The second bridge part 42 locates between the third region 451 and the fourth region 452. In this embodiment, the light-emitting stack 22 and the transparent conductive layer 24 are not completely removed while forming the second trench 43 and the third trench 45. A portion of the light-emitting stack 22 and the transparent conductive layer 24 are reserved to form a second bridge part 42 which used to connect the first light-emitting structure X with the second light-emitting structure Y. A plurality of second extending parts 23B crosses over and passes through a plurality of the second bridge parts 42 to extend to the light emitting regions and conduct current into these light emitting regions. Since the first light-emitting structure X and the second light-emitting structure Y have smaller area of light emitting regions, current can be uniformly spread by the second extending part 23B in the first and the second light-emitting structures X/Y and thereby luminous efficiency of the light-emitting device 4' is improved. As shown in FIG. 4C, the light-emitting device 4" has similar structure with that of the light-emitting structure 4 and further includes an exposing part 47 surrounding the first light-emitting structure X and the second light-emitting structure Y and exposing a first upper surface 221. A portion of the exposing part 47 is not parallel with the first trench 41; another portion of the exposing part 47 is parallel with the first trench 41. A second electrode 23 is formed on the first bridge part 40 and the first and the second light-emitting structures X, Y. A first electrode 21 is formed on the exposing part 47, and a plurality of first extending parts 21B extends along the exposing part 47. Current can be uniformly spread in the first and the second light-emitting structures X, Y, and thereby luminous efficiency of the light-emitting device 4" is improved.

Figure 5A:
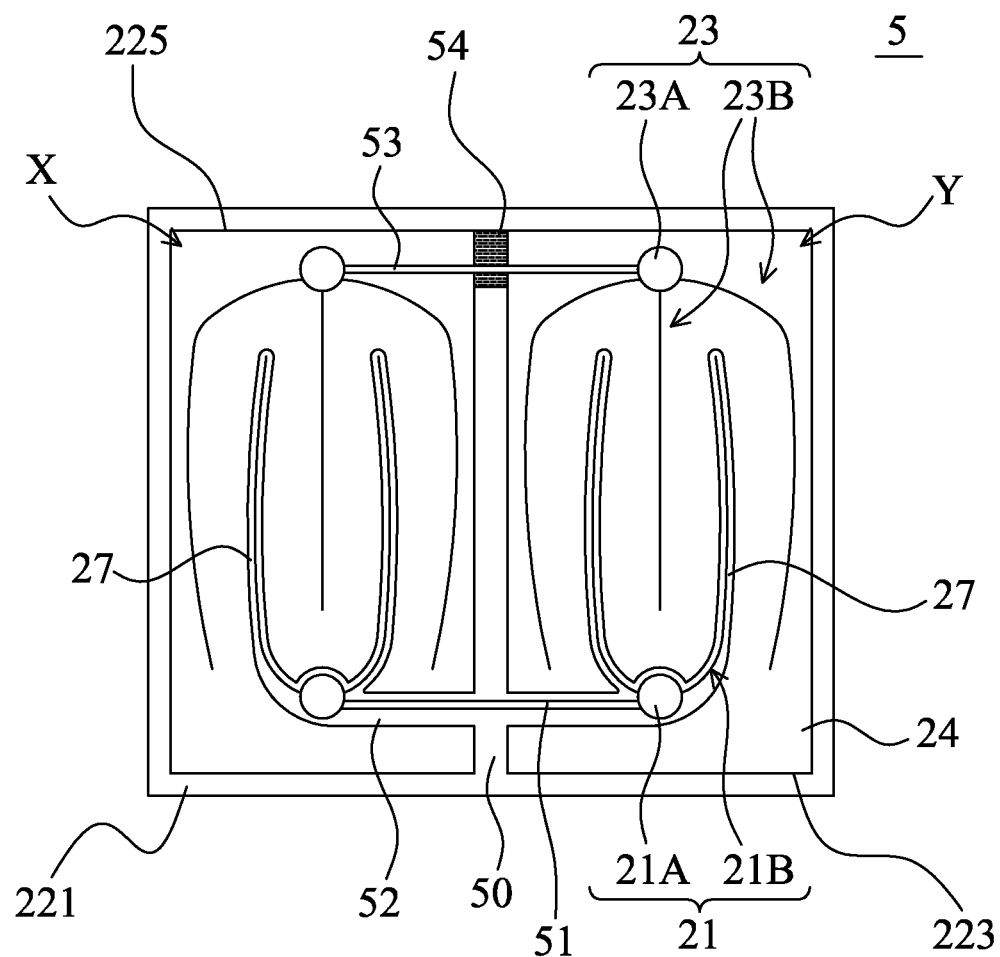
FIGS. 5A~5B are top views of light-emitting devices in accordance with another embodiments of present disclosure.
Figure 5B:
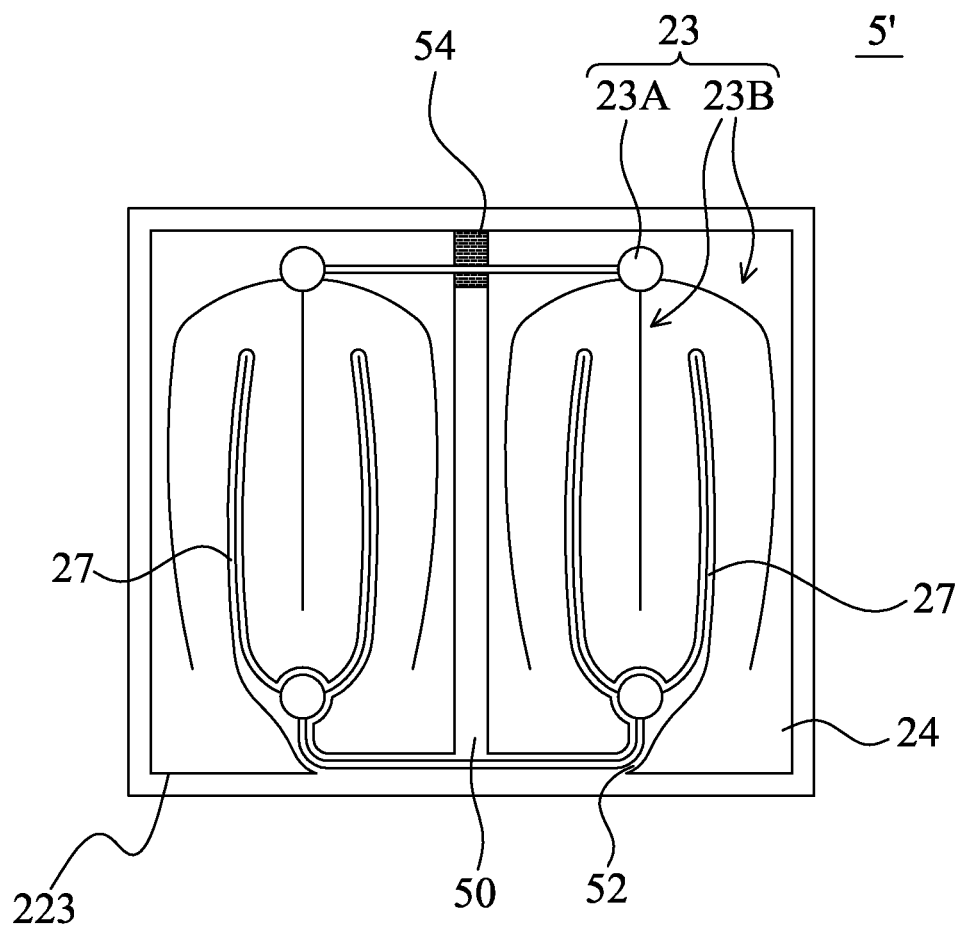

FIG. 5A and FIG. 5B show top views of light-emitting devices 5 and 5' according to another embodiment. As shown in FIG. 5A, the structure of the light-emitting device 5 is similar to that of the light-emitting device 2. A first trench 50 is formed in the transparent conductive layer 24 and the light-emitting stack 22, and exposes a first upper surface 221 so as to separates the transparent conductive layer 24 and the light-emitting stack 22 on the first semiconductor layer 220 into the first light-emitting structure X and the second light-emitting structure Y. In this embodiment, the light-emitting stack 22 and the transparent conductive layer 24 are not completely removed while forming the first trench 50, and a portion of the light-emitting stack 22 and the transparent conductive layer 24 are reserved to form a first bridge part 54 which used to connect the first light-emitting structure X with the second light-emitting structure Y. Second trenches 27 are formed in the first and the second light-emitting structures and expose the first upper surface 221. A first electrode 21 is formed on the first upper surface 221 in the second trench 27; a second electrode 23 is formed on the transparent conductive layer 24. A third trench 52 is formed in the transparent conductive layer 24 and the light-emitting stack 22 so that the first upper surface 221 is exposed. The third trench 52 is not parallel with the first trench 50 and intersects the first trench 50. A first connecting line 51 is formed in the third trench 52 and electrically connects the first pads 21A in the first and the second light-emitting structures X, Y. A second connecting line 53 is formed on the first bridge part 54 and the first and the second light-emitting structures X, Y. The second connecting line 53 is used to electrically connect the second pads 23A in the first and the second light-emitting structures X, Y. The first and the second connecting lines connect the pads in the first and the second light-emitting structures X, Y. Therefore, current can be uniformly spread in the light-emitting structures X, Y so as to improve luminous efficiency of the light-emitting device 5. From the top view, the first light-emitting structure X and the second light-emitting structure Y have the same pattern. In this embodiment, the light-emitting structures having the same pattern indicate that the light-emitting structures have rectangular structures with same size, same electrode layouts, and symmetrical locations of the electrodes. Such configuration benefits the current spreading and alignment during follow-up wire bonding process. As shown in FIG. 5B, the structure of the light-emitting device 5' is similar to that of the light-emitting device 5. The third trench 52 is formed in the first and the second light-emitting structures X, Y and near a first side 223 so a smaller area of the light-emitting stack 22 is removed for forming the third trench 52 and the light-emitting area is not decreased further.

Figure 6:
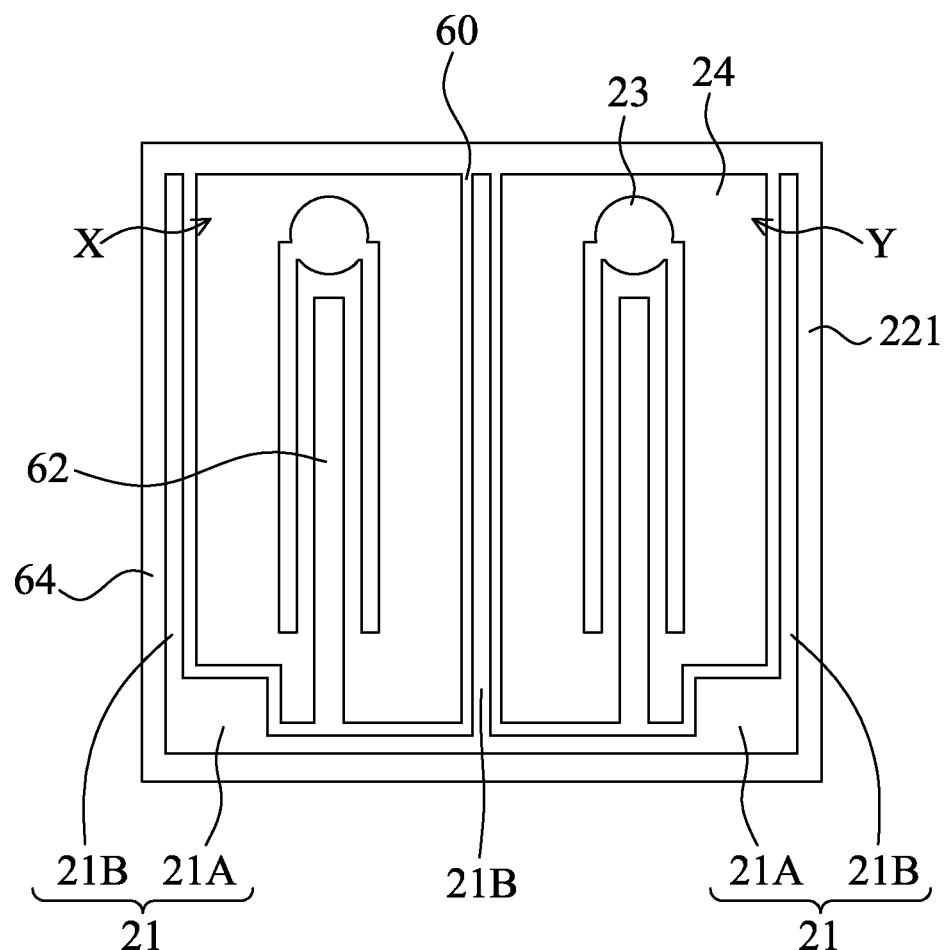
FIG. 6 is a top view of a light-emitting device in accordance with another embodiment of present disclosure.

FIG. 6 shows a top view of a light-emitting device 6 in accordance with another embodiment. As shown in FIG. 6, the light-emitting device 6 has a similar structure to that of the light-emitting device 2. A first trench 60 is formed in the transparent conductive layer 24 and the light-emitting stack 22 and exposes the first upper surface 221 so as to separate the transparent conductive layer 24 and the light-emitting stack 22 on the first semiconductor layer 220 into the first light-emitting structure X and the second light-emitting structure Y. Second trenches 62 are formed in the first and the second light-emitting structures X, Y and expose the first upper surface 221. An exposing part 64 surrounds the first light-emitting structure X and the second light-emitting structure Y and exposes the first upper surface 221. A portion of the exposing part 64 is not parallel with the first trench 60; another portion of the exposing part 64 is parallel with the first trench 60. Second electrodes 23 are formed on the first and the second light-emitting structures X, Y. First pads 21A are formed on the exposing part 64, and a plurality of first extending parts 21B extends along the exposing part 64 and the first trench 60. Current can be uniformly spread in the first and the second light-emitting structures X, Y and luminous efficiency of the light-emitting device 6 is improved. From the top view, the first light-emitting structure X and the second light-emitting structure Y have the same pattern. In this embodiment, the light-emitting structures having the same pattern indicate that the light-emitting structures have rectangular structures with same size, same electrode layouts, and symmetrical locations of the electrodes. Such configuration benefits the current spreading and alignment during follow-up wire bonding process.

Figure 7:
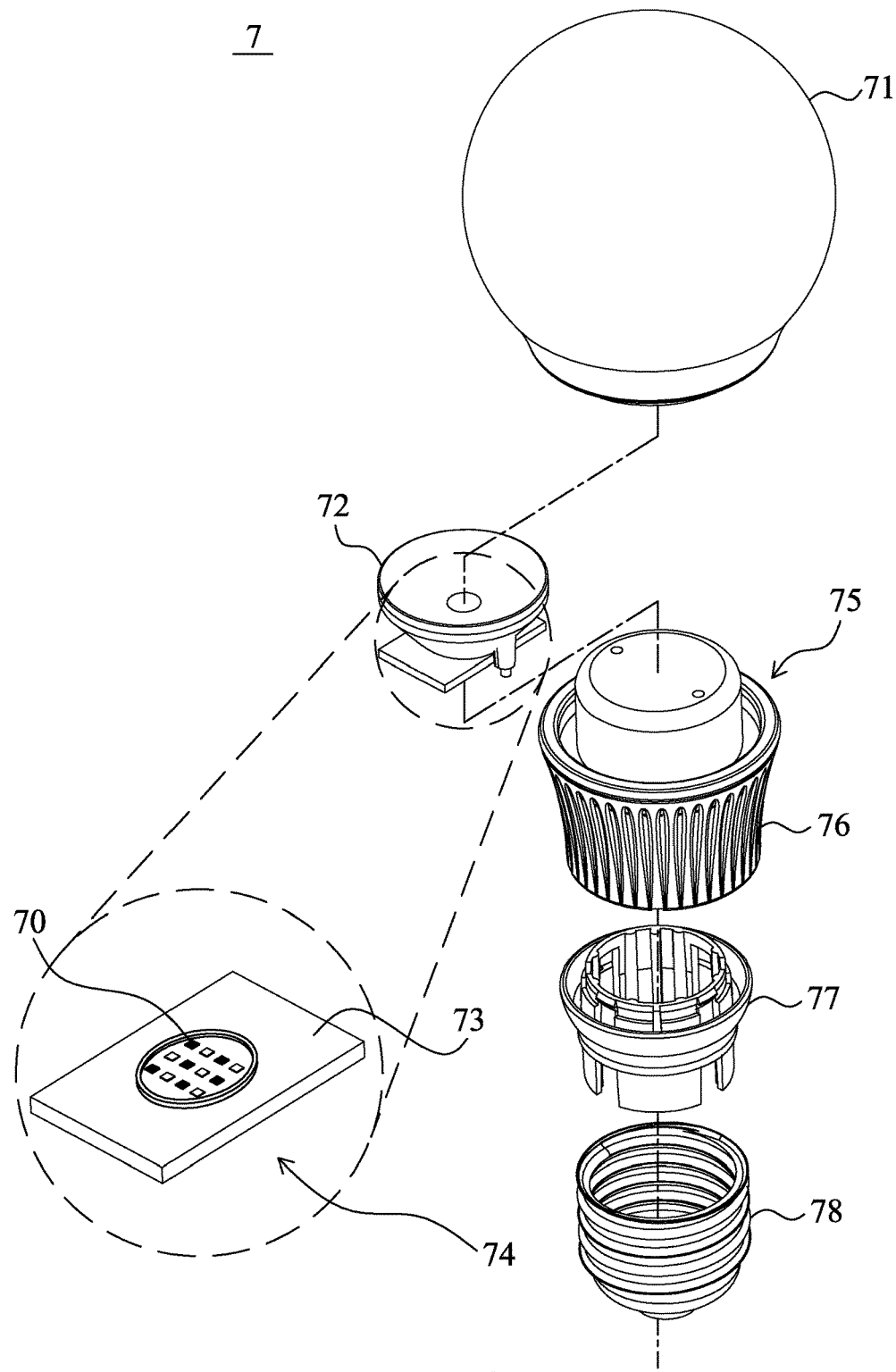
FIG. 7 is a top view of a light-emitting device in accordance with another embodiment of present disclosure.

FIG. 7 shows a light bulb. The light bulb 7 includes a cover 71, a lens 72 set in the cover 71, a light emitting module 74 formed under the lens 72, a lamp holder 75 which is used to support the light emitting module 74 including a heat sink 76, a connecting part 77, and an electrical connector 78. The connecting part 77 connects the lamp holder 75 and the electrical connector 78. The light-emitting module 74 includes a carrier 73 and a plurality of light-emitting devices according to any of the embodiments described above formed on the carrier 73.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:
1. A light-emitting device, comprising:
   a first semiconductor layer having an uppermost surface and a bottommost surface opposite to the uppermost surface;
   a first light-emitting region, a second light-emitting region, and a third light-emitting region formed on the same first semiconductor layer, wherein the first semiconductor layer is continuous;
   a first trench formed between the first light-emitting region and the second light-emitting region, comprising a bottom portion exposing a first surface of the first semiconductor layer;
   a second trench formed between the second light-emitting region and the third light-emitting region, comprising a bottom portion exposing the first surface of the first semiconductor layer;

a third trench formed in one of the first, the second and the third light-emitting regions, exposing the first semiconductor layer and extending along a first direction, wherein the first direction is parallel with the uppermost surface of the first semiconductor layer;

an insulating bridge part formed in the first trench and the second trench, connecting the first, the second, and the third light-emitting regions;

a first electrode formed in the third trench, electrically connecting to the first semiconductor layer; and a second electrode, comprising a second pad formed on one of the first, the second, and the third light-emitting regions and a second extending part extending from the second pad;

wherein the first, the second and the third trenches pass through the uppermost surface of the first semiconductor layer but does not extend to the bottommost surface of the first semiconductor layer;

wherein the second extending part is formed on the insulating bridge part and extends to the first, the second, and the third light-emitting regions.

2. The light-emitting device of claim 1, wherein the first light emitting region and the second light emitting region comprise:

an active layer on the first semiconductor layer;
a second semiconductor layer on the active layer; and
a transparent conductive layer on the second semiconductor layer.

3. The light-emitting device of claim 1, wherein the first electrode comprises a first pad and a first extending part extending from the first pad.

4. The light-emitting device of claim 1, wherein the first electrode comprises an extending direction parallel to the third trench.

5. The light-emitting device of claim 3, further comprising a first side, a second side, a third side, and a fourth side, wherein the first side is opposite to the third side and the second side is opposite to the fourth side; wherein the first pad is adjacent to the first side and the second pad is adjacent to the third side.

6. The light-emitting device of claim 1, wherein the second electrode comprises a plurality of second extending parts, wherein the first electrode is located between the second extending parts.

7. The light-emitting device of claim 1, wherein the first trench comprises an equal width from a top view.

8. The light-emitting device of claim 1, wherein the first trench and/or the second trench is devoid of the first electrode formed therein.

9. The light-emitting device of claim 1, further comprising an exposing part surrounding the first light emitting region, the second light emitting region, and the third light emitting region.

* * * * *